United States Patent
Jordan et al.

(10) Patent No.: US 8,611,953 B2
(45) Date of Patent: Dec. 17, 2013

(54) INTEGRATED GPS RECEIVER AND CELLULAR TRANSCEIVER MODULE FOR AUTOMOTIVE BUS APPLICATIONS

(75) Inventors: David F. Jordan, Danville, NH (US); Thomas S. Laubner, Merrimac, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 201 days.

(21) Appl. No.: 12/961,998

(22) Filed: Dec. 7, 2010

(65) Prior Publication Data
US 2012/0142397 A1  Jun. 7, 2012

(51) Int. Cl.
*H04M 1/00* (2006.01)
*H04B 7/24* (2006.01)

(52) U.S. Cl.
USPC .......................................... 455/556.1; 455/39

(58) Field of Classification Search
USPC ................ 455/404.2, 414.2, 456.1–456.3, 455/99–100, 575.9, 575.7
See application file for complete search history.

(56) References Cited

U.S. PATENT DOCUMENTS

| | | | |
|---|---|---|---|
| 6,272,349 B1 * | 8/2001 | McGrath et al. | 455/456.3 |
| 6,466,172 B1 * | 10/2002 | Ryken et al. | 343/700 MS |
| 2006/0205347 A1 * | 9/2006 | Karabinis | 455/12.1 |
| 2009/0066586 A1 * | 3/2009 | Rao et al. | 343/702 |
| 2011/0109522 A1 | 5/2011 | Merrick et al. | 343/872 |
| 2011/0153209 A1 * | 6/2011 | Geelen | 701/209 |

* cited by examiner

*Primary Examiner* — Charles Appiah
*Assistant Examiner* — Emem Stephen
(74) *Attorney, Agent, or Firm* — Christopher P. Maiorana, PC (57) ABSTRACT

An integrated global positioning system (GPS) receiver and cellular transceiver module including (i) a printed circuit board substrate, (ii) a cellular multiband antenna disposed on the printed circuit board substrate, (ii) at least one first integrated circuit disposed on the printed circuit board substrate for processing signals from and signals to the cellular multiband antenna, (iii) a GPS antenna attached to the printed circuit board substrate, (iv) at least one second integrated circuit disposed on the printed circuit board substrate for processing signals from the GPS antenna and the at least one first integrated circuit, and (v) an electrical connector disposed on the printed circuit board substrate for establishing a data communication path between the at least one first and the at least one second integrated circuits and an electronic system of a vehicle, where the GPS receiver and cellular transceiver module is capable of being integrated into the electronic system of the vehicle.

20 Claims, 6 Drawing Sheets

INTEGRATED GPS RECEIVER AND CELLULAR TRANSCEIVER MODULE FOR AUTOMOTIVE BUS APPLICATIONS

FIELD OF THE INVENTION

The present invention relates to antennas generally and, more particularly, to a method and/or architecture for an integrated GPS receiver and cellular transceiver module for automotive system bus applications.

BACKGROUND OF THE INVENTION

An antenna appropriate for receiving radio frequency (RF) signals transmitted by global positioning system (GPS) satellites is known. The positioning capabilities of the GPS have been incorporated into an automobile. For example, an antenna, such as M/A-COM part ANPC 128, can be used to receive a 1.575 Ghz radio frequency signal and send the received signal to a GPS module. The GPS module can receive the RF signal and generate positioning information and other NMEA (National Marine Electronics Association) data to a data bus of the vehicle.

Mobile communication devices, such as cellular telephones, allow calls to be made and received while operating a vehicle. Cellular telephones can also be used by vehicle operators to call for assistance. However, the many surfaces and mobile nature of automobiles make a challenging environment (i.e., multiple signal paths, reflections, weak signals, etc.) for receiving cellular signals. Also, hands on use of cellular telephones while driving is now recognized as posing a driving hazard. In many areas, the use of cellular telephones that are not hands free in automobiles is banned.

It would be desirable to have an integrated GPS receiver and cellular transceiver module especially packaged to connect directly to standard vehicle wiring harnesses and data buses.

SUMMARY OF THE INVENTION

The present invention concerns an integrated global positioning system (GPS) receiver and cellular transceiver module including (i) a printed circuit board substrate, (ii) a cellular multiband antenna disposed on the printed circuit board substrate, (ii) at least one first integrated circuit disposed on the printed circuit board substrate for processing signals from and signals to the cellular multiband antenna, (iii) a GPS antenna attached to the printed circuit board substrate, (iv) at least one second integrated circuit disposed on the printed circuit board substrate for processing signals from the GPS antenna and the at least one first integrated circuit, and (v) an electrical connector disposed on the printed circuit board substrate for establishing a data communication path between the at least one first and the at least one second integrated circuits and an electronic system of a vehicle, where the GPS receiver and cellular transceiver module is capable of being integrated into the electronic system of the vehicle.

The objects, features and advantages of the present invention include providing a method and/or architecture for an integrated GPS receiver and cellular transceiver module for automotive system bus applications that may (i) provide cellular voice processing through vehicle system bus, (ii) provide cellular GPRS packet data processing through vehicle system bus, (iii) transmit cellular voice data, (iv) transmit cellular GPRS packet data, (v) increase cold start and first time GPS position fix to nearly instantaneous with the use of Assisted GPS (A-GPS), (vi) allow GPS position/location data and cellular data to be transmitted anywhere in the world where there is mobile phone coverage, (vii) increase GPS performance in weak GPS signal environments with use of A-GPS, (viii) provide data for vehicle tracking systems, (ix) provide data for vehicle fleet tracking systems, (x) provide data for vehicle navigation systems, (xi) support theft deterrent systems, (xi) support theft recovery systems, (xii) provide information for advanced driver assistance systems (ADAS), and/or (xiii) provide GPS position data (e.g., latitude, longitude) to the vehicle system bus.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
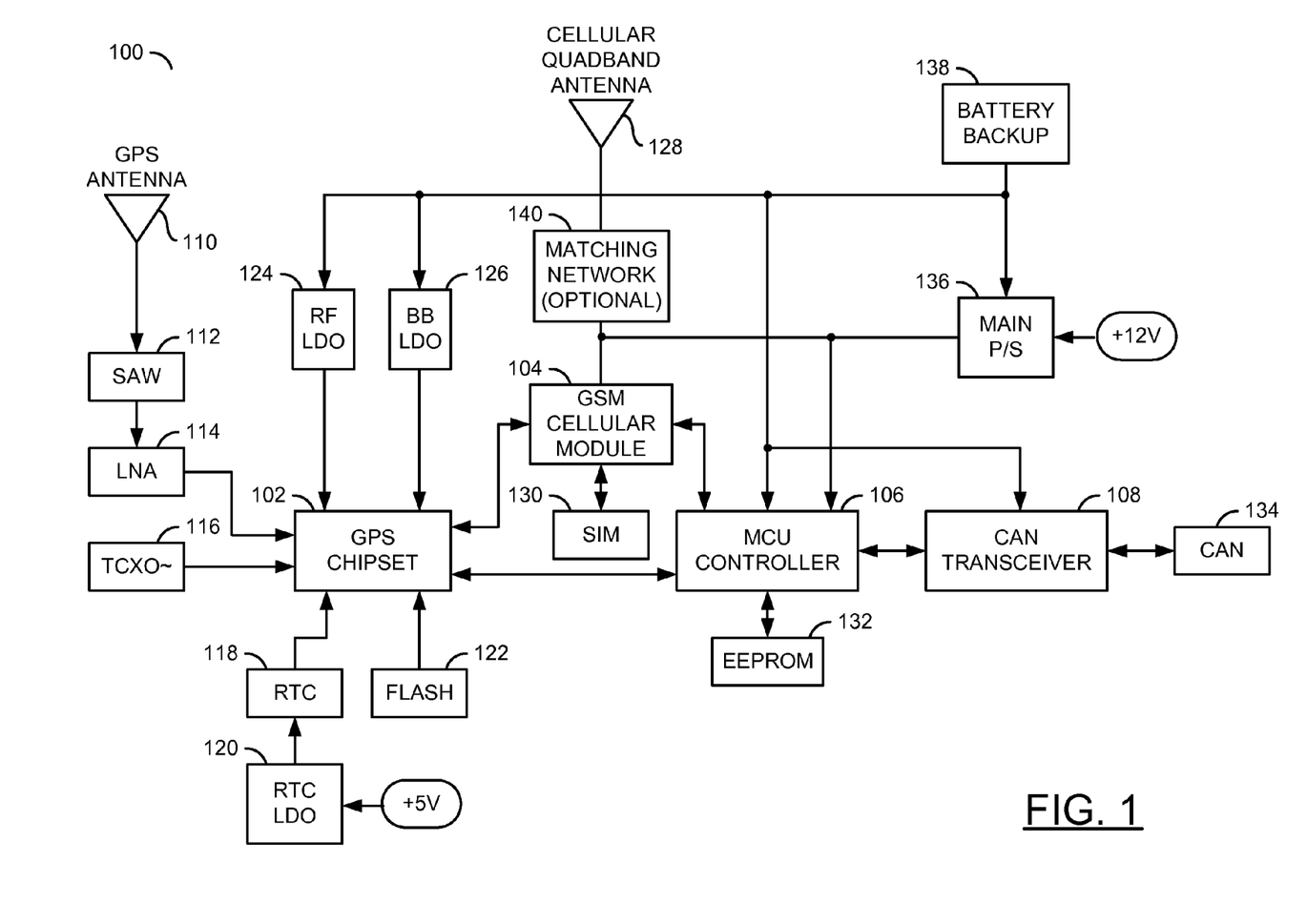
FIG. 1 is a block diagram illustrating an example architecture in accordance with an embodiment of the present invention.

Referring to FIG. 1, a block diagram of a system 100 is shown illustrating an example architecture in accordance with a preferred embodiment of the present invention. The system 100 may implement an integrated GPS receiver and cellular transceiver module in accordance with a preferred embodiment of the present invention. The system 100 may comprise a block (or circuit) 102, a block (or circuit) 104, a block (or circuit) 106, a block (or circuit) 108, a block (or circuit) 110, a block (or circuit) 112, a block (or circuit) 114, a block (or circuit) 116, a block (or circuit) 118, a block (or circuit) 120, a block (or circuit) 122, a block (or circuit) 124, a block (or circuit) 126, a block (or circuit) 128, a block (or circuit) 130, a block (or circuit) 132, a block (or circuit) 134, a block (or circuit) 136, a block (or circuit) 138, and a block (or circuit) 140.

The block 102 may be implemented, in one example, as a GPS chip set. The block 104 may be implemented, in one example, as a GSM cellular module. In one example, the block 104 may comprise an independently certified drop-in module. For example, the block 104 may be implemented with LEON-G100/G200 Quad Band GSM/GPRS Data and Voice modules (e.g., available from U-blox America, 1902 Campus Commons Drive, Suite 310, Reston, Va. 20191). The block 106 may be implemented, in one example, as an MCU controller. The block 108 may be implemented, in one example, as a controller area network (CAN) transceiver. The block 110 may be implemented as a GPS antenna. In one example, the antenna 110 may be implemented as a microstrip patch antenna. The block 112 may be implemented as a surface acoustic wave (SAW) filter. The block 114 may be implemented as a low noise amplifier (LNA). The block 116 may be implemented as a crystal reference frequency oscillator (TCXO) for the GPS chip set 102. The block 118 may be implemented as a real time clock (RTC) oscillator. The block 120 may be implemented as a low drop out (LDO) regulator for the real time clock oscillator 118. The block 122 may be implemented as a data storage area. In one example, the storage area 122 may store operating software and/or data for the GPS chip set 102. In one example, the block 122 may be implemented as a FLASH memory. The block 124 may be implemented as a low drop out (LDO) regulator for providing regulated voltage to a RF front end of the GPS chip set 102. The block 126 may be implemented as a low drop out (LDO) regulator for providing a regulated voltage to a baseband portion of the GPS chip set 102. The block 128 may be implemented, in one example, as a cellular quadband antenna. In one example, the block 128 may be implemented as an integrated folded inverted F quadband antenna. The block 130 may be implemented as a subscriber identity module (SIM). The block 132 may be implemented as a non-volatile memory. In one example, the block 132 may comprise an electrically erasable programmable read only memory (EEPROM). The block 134 may be implemented, in one example, as a CAN bus connection. The block 136 may be implemented as a main power supply for the system 100. The block 138 may be implemented as a battery backup system. The block 140 may be implemented as a matching network. The block 140 may be optional. For example, depending on the efficiency of the implementation of quadband antenna 128, the block 140 may be omitted without affecting performance of the system 100.

The GPS chipset 102 may be implemented, in one example, with discrete surface mount devices (SMDs). In one example, the GPS chipset 102 may be implemented similarly to the GPS circuitry described in U.S. Pat. No. 6,272,349, which is herein incorporated by reference in its entirety. In one example, the GPS antenna 110 may be configured for receive-only operation of low level GPS satellite signals. The filter 112 may be implemented, in one example, as a passband filter operating at L1 GPS (e.g., 1575.42±1 MHz). The filter 112 may be configured to attenuate unwanted out-of-band RF signals to the GPS chip set 102 and periphery circuitry. The low noise amplifier 114 may be used to amplify low level GPS signals received by the system 100 with a low signal-to-noise ratio (SNR). The block 116 generally provides a crystal controlled reference frequency signal to the GPS chipset 102. The GPS chip set 102 generally receives and processes the GPS signals. The block 132 may provide data storage for last known satellite fixes, module ID storage, etc.

In one example, the blocks 112 and 114 may be optional. For example, depending on the application, one or both of the blocks 112 and 114 may be omitted. In one example, the block 102 may be implemented with an internal amplifier and filter. For example, a GPS chipset may have an internal amplifier, filter, and automatic gain control already incorporated (e.g., in connection with anti-jamming capabilities). However, the inclusion of anti-jamming capabilities may affect dead reckoning (DR) performance of the GPS chipset. Dead reckoning generally refers to a process of estimating a current position based upon a previously determined position, or fix, and advancing that position based upon known or estimated speeds (e.g., from sensors within a vehicle) over an elapsed time, and course.

The cellular quadband antenna 128 may be configured for reception and transmission of mobile telephony signals. In one example, the antenna 128 may be configured for operation with a GSM (Global System for Mobile Communications: originally Groupe Spécial Mobile) mobile telephony system. The antenna 128 and the module 104 may support, in one example, GSM cellular telephone and General Packet Radio Service (GPRS) communication protocols. The antenna 128 may operate with signals in various GSM carrier ranges (e.g., 400/450 MHz, 850/900 MHz, 1800/1900 MHz, etc.). For example, second generation (2G) GSM networks may operate in the 900 or 1800 MHz bands. In locations where the 900 or 1800 MHz bands are already allocated (e.g., in the U.S. and Canada), 850 and 1900 MHz bands may be used.

The antenna 128 may be coupled to the module 104 either directly or via the matching network 140. The matching network 140 generally matches an input/output impedance of the module 104 with an output/input impedance of the antenna 128 to maximize performance and/or minimize power consumption. The antenna 128 may be dimensioned (sized, scaled, etc.) such that the input/output impedance matches the specification of the module 104. When the input/output impedance matches the specification of the module 104, the matching network 140 may be omitted.

GSM modem chips need to be licensed in every country in which the part is sold. The module 104 is generally implemented as a pre-certified (e.g., licensed) drop-in chip to keep costs down. The module 104 may be connected to the GPS chipset 102, the controller 106 and the SIM 130. In addition to cellular telephony data, the module 104 may be configured to communicate assisted GPS (aGPS) related data to the GPS chipset 102 and transmit GPS position information via the quadband antenna 128. The SIM 130 may be implemented, in one example, as a detachable smart card. The SIM 130 may contain subscriber information and phonebook data for a user. The SIM 130 generally allows the user to change vehicles including embodiments of the present invention while retaining their information. Alternatively, the user may change carriers (e.g., cellular phone service providers), while retaining the vehicle, simply by changing the SIM 130.

The controller 106 generally connects with the GPS chipset 102, the module 104 and the CAN transceiver 108. The CAN transceiver 108 may be implemented with discrete surface mounted devices. The CAN transceiver 108 generally provides a transceiver interface to the CAN bus of the vehicle via the CAN connector 134. However, other system busses and transceiver interfaces may be implemented to meet the design criteria of a particular implementation. The system 100 may also include a main power supply 136 that may receive a +12V power supply from the vehicle (e.g., alternator, battery, etc.). A back-up battery 138 may be implemented also to make the system 100 more robust.

Figure 2:
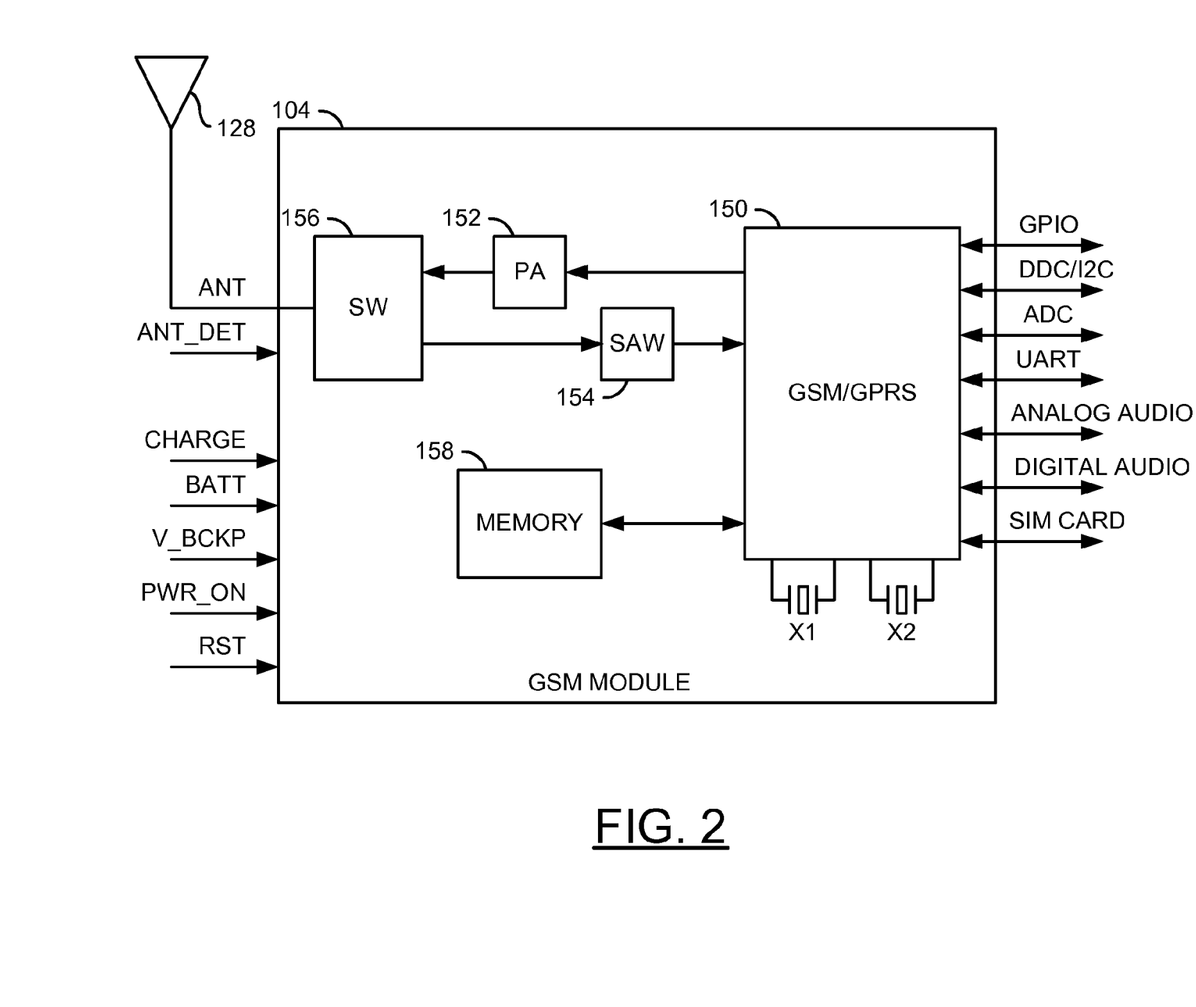
FIG. 2 is a block diagram illustrating an example GSM quad band data and voice module of FIG. 1.

Referring to FIG. 2, a block diagram is shown illustrating an example implementation of the GSM module 104 in FIG. 1. In one example, the module 104 may have a number of inputs that may receive a number of signals (e.g., ANTENNA DETECT, CHARGER, VCC(BATTERY), V_BCKP, POWER_ON, ADC, and EXTERNAL RESET), a connection for coupling the module 140 to the antenna 128, and a number of input/outputs (e.g., GPIO, DDC (for GPS), UART, ANALOG AUDIO, DIGITAL AUDIO, and SIM CARD).

In one example, the GSM module 104 may comprise a block (or circuit) 150, a block (or circuit) 152, a block (or circuit) 154, a block (or circuit) 156, and a block (or circuit) 158. The block 150 may be implemented as a single chip GPS/GPRS modem. The block 152 may be implemented as a power amplifier. The block 154 may be implemented as a standing acoustical wave (SAW) filter. The block 156 may be implemented as an antenna switch. The block 158 may be implemented as a memory. The block 150 generally receives/ presents the input/outputs GPIO, DDC, UART, ANALOG AUDIO, DIGITAL AUDIO, and SIM CARD. The block 150 may connect to a first crystal and a second crystal. In one example, the block 150 may be connected to 26 MHz and 32.768 KHz crystals.

The block 150 may have an output that may present a signal to an input of the block 152 and an input that may receive a signal from the block 154. An output of the block 152 may present a signal to the antenna 128. An input of the block 154 may receive a signal from the antenna 128. The block 150 may have an input/output that may connect with an input/ output of the block 158.

Figure 3:
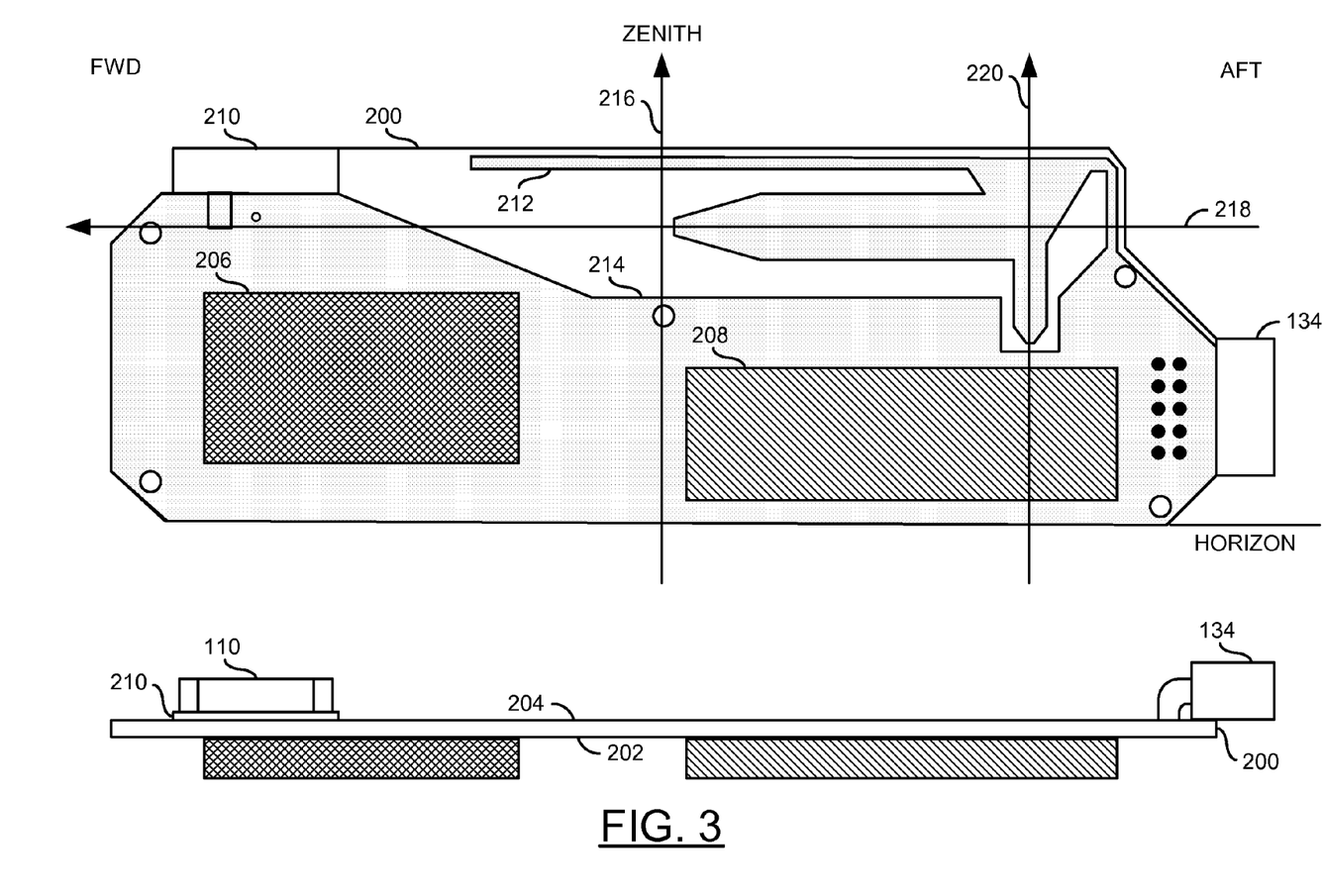
FIG. 3 is a diagram illustrating an example implementation of an integrated GPS receiver and cellular transceiver module in accordance with an example embodiment of the present invention.

Referring to FIG. 3, a diagram is shown illustrating a printed circuit board (PCB) substrate 200 implemented in accordance with a preferred embodiment of the present invention. The PCB substrate 200 may have a first (front) side 202 and a second (back) side 204. The front side 202 may have an area 206 in which the GPS receiver chip set 102 and associated circuitry may be mounted and an area 208 in which the cellular quadband transceiver 104 and associated circuitry may be mounted. The CAN transceiver 108 and associated circuitry may be mounted also in the area 208. In one example, the GPS antenna 110 may be mounted parallel to the back surface 204 of the PCB substrate 200. A ground plane 210 may be disposed between the GPS antenna 110 and the back surface 204 of the PCB substrate 200. A via in the PCB substrate 200 may accept a contact pin of the antenna 110 to couple the antenna 110 with the GPS chipset 102.

In one example, the front surface 202 of the PCB substrate 200 may have a metallization layer implementing the integrated cellular quadband antenna 128. The metallization layer implementing the integrated cellular quadband antenna 128 may, in one example, be on a side of the PCB substrate 200 opposite from the side where the GPS antenna 110 is mounted. However, the integrated cellular quadband antenna 128 is generally implemented on an internal metallization layer to provide better shielding from the GPS signals. In one example, the integrated cellular quadband antenna 128 may be configured as a cellular quadband folded inverted F antenna.

The GPS antenna 110 generally has a right hand circular polarization (CP), whereas the cellular quadband antenna 128 generally provides polarization diversity while covering the bands of the cellular spectrum. Polarization diversity generally refers an ability to receive signals with more than one orientation. Polarization diversity may be obtained, in one example, by combining pairs of antennas with orthogonal polarizations (e.g., horizontal/vertical, ±slant 45°, Left-hand/ Right-hand CP, etc.). Reflected signals may undergo polarization changes depending on the media. By pairing two complementary polarizations, polarization diversity may immunize a system from polarization mismatches that would otherwise cause signal fade. Additionally, such diversity is less susceptible to the near random orientations of transmitting antennas. Polarization diversity is useful in systems where a receiver is moving relative to the transmitter.

The metallization layer of the PCB 200 may have a portion 212 forming the integrated cellular quadband antenna 128 and a portion 214 providing a ground plane for the integrated cellular quadband antenna 128. A feed (e.g., a microstrip transmission line) from the cellular module 104 to the cellular quadband antenna 128 may be buried within the layers of the PCB 200 for shielding and/or isolating the cellular portion from the GPS portion. The integrated cellular quadband antenna 128 may have a short-circuit stub connecting the antenna portion 212 to the ground plane portion 214.

An arrow 216 generally indicates an orientation of the PCB substrate 200 with respect to a zenith of an automotive environment in which the PCB substrate 200 may be mounted. When a module incorporating the PCB substrate 200 is mounted within the automotive environment, the zenith represents the direction going vertically through the top of the vehicle and the horizon (or horizontal axis) generally runs front to back (forward to aft) of the vehicle. With respect to the integrated cellular quadband antenna 128, an arrow 218 generally indicates a cellular horizontal polarization axis of the folded inverted F quadband antenna 128, and an arrow 220 generally indicates a cellular vertical polarization axis of the folded inverted F quadband antenna 128.

The teachings of the present invention are also applicable to other applications having similar functional requirements such as embedded cellular telephones and data terminals, proximity sensors, or any other wireless communications devices. The integrated GPS receiver and cellular transceiver system 100 generally comprises the multilayer PCB substrate 200 and the patch antenna 110 mounted directly on the side 204 of the PCB 200. The patch antenna 110 may be optimized to receive a 1.575 Ghz RF signal from GPS satellites. The term multilayer PCB generally refers to a PCB having a number of alternating layers of dielectric and conductive printed traces interconnected by conductive vias in a particular pattern that is appropriate for a given electrical circuit (see FIG. 6).

An output of the antenna 110 (not shown) may be interconnected to the filter 112 and LNA 114 through interconnecting vias and traces (not shown) on an intermediate layer of the PCB 200 to complete an RF filter system. However, as mentioned above, depending on the implementation of the GPS chipset 102, one or both of the filter 112 and the LNA 114 may be omitted. A filtered RF signal may be output from the RF filter system to the GPS chipset 102. All, but a portion of the side 204 of the PCB 200 surrounding the components mounted thereto may be metalized to form a shielding ground plane to improve performance of the system 100.

The RF processing system and digital processing system may be disposed on the side 202 of the PCB 200. The RF processing system may comprise a RF application specific integrated circuit (ASIC) die, which in one example may be a NAVSTAR ROCS integrated circuit. The RF ASIC die may be mounted directly to the PCB 200 using "chip on board" manufacturing technology. "Chip on board" manufacturing technology is known in the art and comprises mounting an integrated circuit (IC) die directly to a PCB substrate, wirebonding IC contacts to conductive traces printed onto the PCB, and covering the IC and wirebonds with a protective polymer. "Chip on board" manufacturing technology advantageously obviates the need for separately packaging each IC which helps to reduce the physical size and cost of the resulting circuit.

Circuitry supporting the RF ASIC may also mounted to the side 202 of the PCB 200 using either "chip on board" or surface mount technology as appropriate. Interconnecting traces and vias present in the PCB 200 interconnect the RF ASIC with the supporting circuitry and the GSM module 104. Advantageously, the "chip on board" technology removes the use of packaging for the RF ASIC and significantly shortens the length of interconnecting traces through which the analog signals travel. The shortened length reduces the amount of resistive and reactive impedances and, therefore, also reduces signal degradation and loss present in prior art solutions. The RF ASIC and supporting circuitry perform functions that include frequency generation of the local oscillator (LO) and downconversion of the RF signal to an intermediate frequency (IF). The RF processing system outputs an IF signal indicative of the received RF signal. An IF OUT interconnecting trace interconnects the processed RF signal to a digital processing system.

The digital processing system may comprise a digital ASIC, which in one example may comprise a NAVSTAR XR7 digital ASIC. The NAVSTAR XR7 digital ASIC may be specifically optimized to receive and process an IF signal from a received GPS RF signal and transmit the processed data to the CAN bus or receive data from the CAN bus, the cellular module 104, supporting digital circuitry, the program memory 122, and the data memory 132. Interconnecting traces and vias present in the PCB 200 interconnect the digital ASIC, the module 104, supporting digital circuitry, the program memory 122, and the data memory 132. The digital ASIC may interconnected to the program and data memories 122 and 132 directly or through the controller 106, for example, through a plurality of parallel interconnection traces.

The digital ASIC samples and digitizes the received IF signal, correlates the data, detects the satellite code, calculates position, velocity and time as a function of the received RF signal and formats the position velocity and time data to be read from the bus. The digital ASIC also reads and interprets bus data and may perform diagnostic self-check of the entire GPS system. An output of the digital ASIC may comprise digital data representing position and velocity of the vehicle in which the patch antenna 110 is disposed. Similar to the side 204 of the PCB 200, all but a portion of the side 202 of the PCB 200 surrounding the RF processing system, the cellular module components, the digital processing system components, and interconnecting traces may be metalized to form a shielding ground plane 214 that may improve performance of the GPS receiver and cellular transceiver system 100. In one example, the block 104 may be implemented with, but is not limited to, a LEON-G100/G200 Quad Band GSM/GPRS Data and Voice module (e.g., available from U-blox America, 1902 Campus Commons Drive, Suite 310, Reston, Va. 20191). However, the block 104 may be implemented with other quad band cellular data and voice modules.

The PCB 200 may have a ten (10) position connector 134 mounted thereon. The connector 134 supplies power from an external source (e.g., vehicle power supply), and reference potential to the entire GPS receiver and cellular transceiver system 100. The processed GPS and cellular information may be communicated to and from circuits external to the PCB 200 via the connector 134. Each digital line (or pin) of the connector 134 may be capacitively filtered (e.g., with chip capacitors positioned between each one of a plurality of signal terminals and the reference potential). Digital data from the system 100 may be communicated to a main processor area (not shown), typically a large PCB, mounted in an automobile that centralizes all of the intelligence functions for the automobile.

The GPS and cellular information is generally among many pieces of information received and processed by the main on board computer of the automobile. The connector 134, as shown in the drawings, is generally chosen for matability with an existing cable assembly in the automobile. Alternatively, other connectors may be equally suitable provided the cable assembly of the automobile is equipped to interface with the connector chosen. Advantageously, any degradation of the digital signal over the cable in the cable assembly can be recovered through signal processing without compromise in the sensitivity of the overall GPS receiver system.

Figure 4:
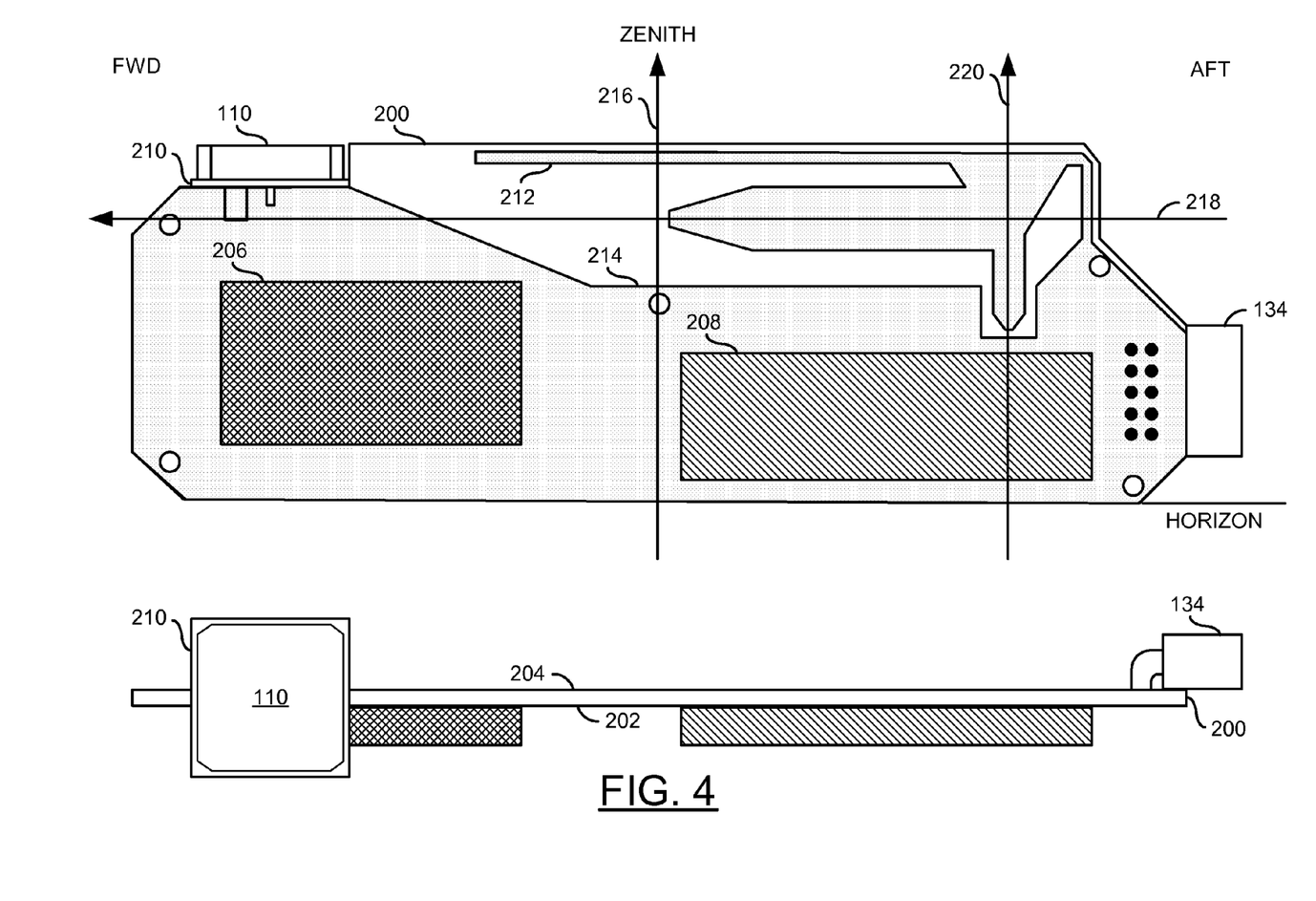
FIG. 4 is a diagram illustrating the example implementation of an integrated GPS receiver and cellular transceiver module of FIG. 2 with an alternate GPS antenna placement.

Referring to FIG. 4, a diagram is shown illustrating the printed circuit board (PCB) substrate 200 of FIG. 2 with the GPS antenna 110 mounted in an alternate orientation in accordance with the present invention. In one example, the GPS antenna 110 may be mounted perpendicular to an edge of the PCB. The GPS antenna 110 may be separated from the edge of the PCB substrate by the ground plane 210. The orientation of GPS antenna 110 is generally determined based upon a mounting location of the system 100 within the vehicle. For example, the GPS antenna 110 may be mounted as shown in FIG. 2 when the system 100 is configured for mounting to a windshield and as shown in FIG. 3 when the system 100 is configured for mounting elsewhere in the vehicle. In general, the orientation of the GPS antenna 110 is selected such that when the system 100 is mounted in the vehicle the GPS antenna 110 is oriented to maximize a view of the sky.

Figure 5:
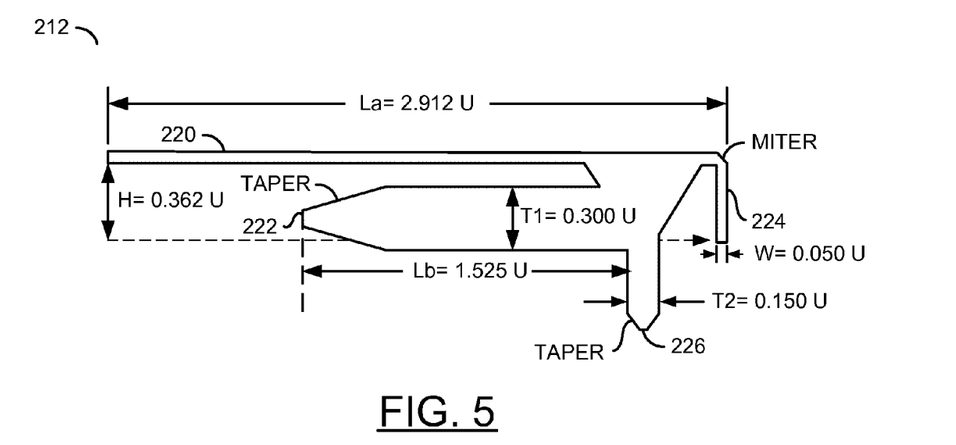
FIG. 5 is a diagram illustrating an example geometry and dimensions for a cellular quadband polarization diversity antenna in accordance with embodiments of the present invention.

Referring to FIG. 5, a diagram is shown illustrating an example geometry and dimensions of the metallization 212 forming the folded inverted F quadband antenna 128 in accordance with an embodiment of the present invention. The folded inverted F quadband antenna 128 may have a first open-circuit stub 220, a second open circuit stub 222 and a short-circuit stub 224. The first and second open-circuit stubs may run parallel with the ground plane 214. The first open-circuit stub 220 may be longer and narrower than the second open-circuit stub 222. The second open-circuit stub 220 may have a taper at an unconnected end. The short-circuit stub 224 may have a portion aligned with an axis of the first open-circuit stub 220 and a portion folded at a right angle to the axis of the first open-circuit stub 220. The right angle of the short-circuit stub 224 may be formed with a miter to avoid poor current flow on the short-circuit stub. The folded portion of the short-circuit stub 224 connects to the ground plane 214.

The first open-circuit stub 220 and the short-circuit stub 224 may have a width (e.g., W) of about 0.05 standard units (U). The first open-circuit stub 220 may have a length (e.g., La) of about 2.912 U. The second open-circuit stub 222 may have a length (e.g., Lb) of about 1.525 U and a width (e.g., T1) of about 0.3 U. The integrated folded inverted F quadband antenna 128 may have a height (e.g., H) of about 0.362 U. An input/output 226 of the integrated folded inverted F quadband antenna 128 may have a width (e.g., T2) of about 0.15 U. The input/output 226 of the integrated folded inverted F quadband antenna 128 may be tapered to compensate for differences between an input/output of the cellular transceiver circuitry 104 and the antenna 128.

The dimensions of the antenna 128 are given in the standard unit U because the antenna 128 may be scaled to meet the design criteria of a particular implementation. For example, the metallization 212 forming the folded inverted F quadband antenna 128 is generally laid out for a high temperature, high glass transition temperature (Tg), lead free material dielectric constant substrate (e.g., FR4). However, the antenna 128 may be configured (e.g., scaled) for various substrates (e.g., custom blended), with various dielectric constants, with a scaling factor. The scaling factor may make the antenna 128 larger or smaller. Making the antenna 128 larger increases the efficiency of the antenna, while making the antenna 128 smaller decreases the efficiency with respect to effective aperture.

Scaling the antenna 128 does not generally affect the function of the antenna. However, the matching network 140 may need to be implemented when the antenna is scaled smaller. In general, the metallization 212 forming the folded inverted F quadband antenna 128 provides an impressive vertical standing wave ratio (VSWR) for all cellular bands without the matching network 140. The input/output 226 of the metallization 212 may be connected into a discrete matching network (if implemented), microstrip, or stripline.

A vertical aperture of the antenna 128 is generally short but efficient. The low band is folded over, thus having a significant capacitance to ground. The capacitance to ground of the stubs 220 and 222 is generally balanced out by the inductance to ground provided by the stub 224. However, discrete matching components may be implemented to meet the design criteria of a particular implementation. For example, on an alumina (e.g., K10) substrate, the antenna may be scaled or matched with a matching network. The aperture is generally fixed by the antenna layout. In one example, the best match may be when both the antenna 128 and GSM module 104 have input/output impedances of 50 ohms. As the impedance of the antenna 128 deviates from 50 ohms (e.g., due to scaling), the matching network 140 may be used to improve mismatch losses by bringing the input/output impedances back to a 1:1 ratio.

Figure 6:
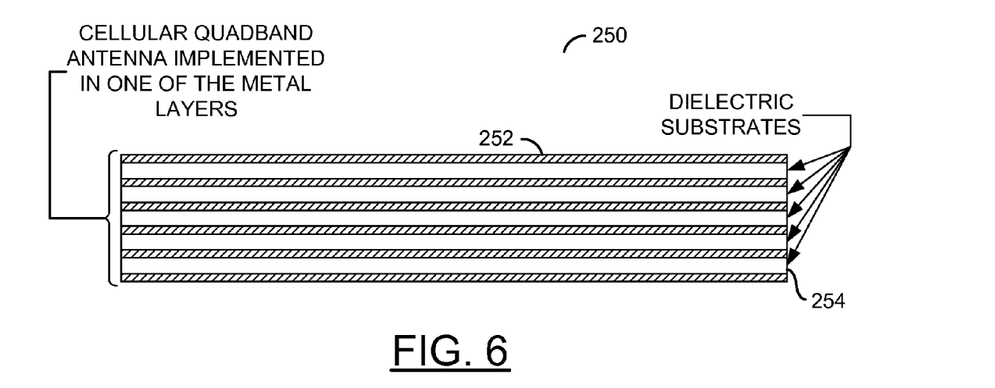
FIG. 6 is a diagram illustrating various layers of a multilayer printed circuit board substrate in accordance with embodiments of the present invention.

Referring to FIG. 6, a diagram is shown illustrating layers of a PCB substrate 250. The PCB substrate 250 may be implemented as a multilayer structure. In one example, the PCB substrate 250 may be implemented with six metal layers 252, separated by dielectric layers 254. The PCB substrate 250 may be used to implement the PCB substrate 200. In one example, the integrated folded inverted F quadband antenna 128 may be implemented in one of the six metallization layers of the PCB substrate 250. Interconnecting traces and vias may be implemented in other layers of the PCB substrate 250. The interconnecting traces and vias may interconnect the various circuits illustrated in FIG. 1. Ground planes on different layers may be connected with multiple vias to improve shielding from the GPS signals.

Figure 7:
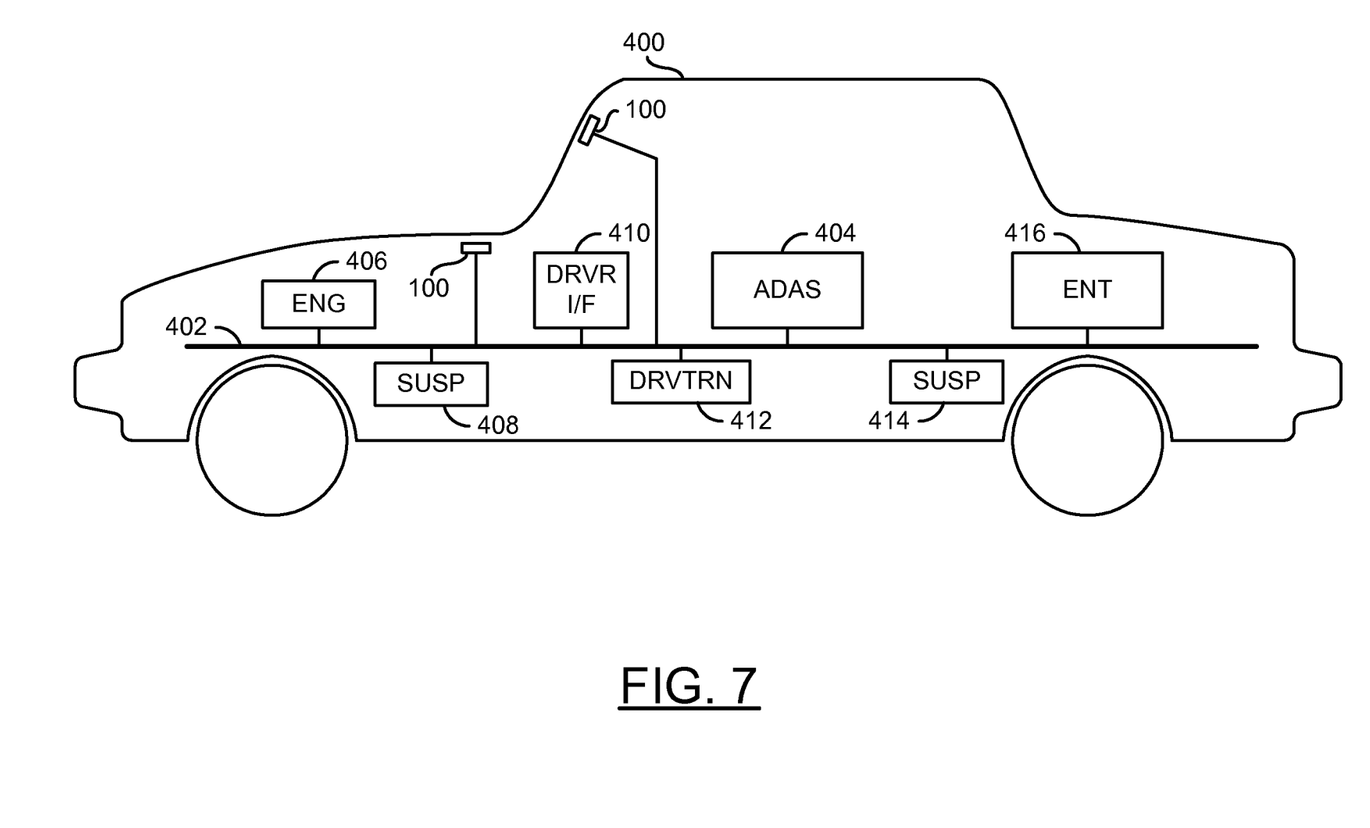
FIG. 7 is a diagram illustrating an example application in accordance with a preferred embodiment of the present invention.

Referring to FIG. 7, a diagram is shown illustrating an example application of an integrated GPS receiver and cellular transceiver module 100 in accordance with a preferred embodiment of the present invention. In one example, the integrated GPS receiver and cellular transceiver module 100 may be mounted in a vehicle 400. For example, the integrated GPS receiver and cellular transceiver module 100 may be mounter under a dashboard, against the windshield, or any other place in the vehicle where a view of the sky (e.g., through an RF permeable material) may be obtained by the integrated GPS antenna. The vehicle 400 may further include a system bus 402 (e.g., a CAN bus, etc.), an advanced driver assistance system (ADAS) 404, and a number of sensors and/or actuators distributed around the vehicle. The term sensor generally refers to a device that generates a signal representative of a sensed condition (e.g., temperature, level, position, speed, etc.). The term actuator generally refers to a device that is configured to control a parameter or object in response to a control signal (e.g., solenoid, heater, lamp, etc.). The sensors and/or accusatory may include, but are not limited to, engine-related devices 406, front suspension related devices 408, driver interface devices 410, drive train related device 412, rear suspension related devices 414, and entertainment related systems 416.

The integrated GPS receiver and cellular transceiver module 100, the sensors and/or the accusatory may feed information to and receive control signals from the ADAS system 404. The integrated GPS receiver and cellular transceiver module may provide information to the ADAS system 404 which may be used to control various systems of the automobile. The information provided may enhance the performance of the ADAS system 404 in assisting the driver/operator. For example, information from the integrated GPS receiver and cellular transceiver module 100 may provide advanced information on local road conditions, topology, points of interest, etc. that may augment information already stored in the vehicle. The ADAS system 404 may provide information received from the integrated GPS receiver and cellular transceiver module 100 to the driver/operator and/or employ the information to alter one or more vehicle characteristics (e.g., drive train, suspension, steering, braking and stability control assistance, adaptive cruise control, lane departure warning, predictive lighting, curve warning, etc.).

The alterations made by the ADAS system 404 may be configured, for example, to increase fuel economy and/or safety of the vehicle. The integrated GPS receiver and cellular transceiver module 100 may further be used to relay information from the ADAS system 404 and/or sensors to a remote site or sites. For example, vehicle performance information along with vehicle location and driving parameters may be relayed to a remote site where the information may be used to update maps and/or driver assistance information. The updated maps and/or driver assistance information may then be sent back to the vehicle to update on-board performance and response parameters.

As will be apparent to one of ordinary skill in the relevant art(s), the present invention may be optimized for an integrated GPS receiver and cellular transceiver mounted in other vehicles, in a hand held unit, as well as other applications.

While the invention has been particularly shown and described with reference to the preferred embodiments thereof, it will be understood by those skilled in the art that various changes in form and details may be made without departing from the spirit and scope of the invention.

The invention claimed is:

1. An integrated global positioning system (GPS) receiver and cellular transceiver module comprising:

a printed circuit board (PCB) substrate;

a cellular multiband antenna disposed on the printed circuit board substrate, wherein said cellular multiband antenna and a ground plane are formed in a single metallization layer of said printed circuit board substrate and said cellular multiband antenna comprises a first open-circuit stub, a second open-circuit stub and a short-circuit stub, the first open-circuit stub having a length of about 2.912 units and a width of about 0.05 units, the second open-circuit stub having a length of about 1.525 units and a width of about 0.3 units, and the short-circuit stub having a length of about 0.362 units and a width of about 0.05 units, respectively, said short-circuit stub being connected to said ground plane, said second open-circuit stub and said first open-circuit stub running parallel with said ground plane;

at least one first integrated circuit disposed on the printed circuit board substrate for processing signals from and signals to the cellular multiband antenna;

a GPS antenna attached to the printed circuit board substrate;

at least one second integrated circuit disposed on the printed circuit board substrate for processing signals from the GPS antenna and the at least one first integrated circuit; and an electrical connector disposed on the printed circuit board substrate for establishing a data communication path between the at least one first and the at least one second integrated circuits and an electronic system of a vehicle, wherein the GPS receiver and cellular transceiver module is capable of being integrated into the electronic system of the vehicle.

2. The integrated GPS receiver and cellular transceiver module according to claim 1, wherein said cellular multiband antenna comprises a cellular quadband polarization diverse folded inverted F antenna formed in a single conductive layer of said printed circuit board substrate.

3. The integrated GPS receiver and cellular transceiver module according to claim 1, wherein said cellular multiband antenna is configured to receive both horizontally polarized and vertically polarized cellular signals.

4. The integrated GPS receiver and cellular transceiver module according to claim 1, wherein the at least one first integrated circuit and the at least one second integrated circuit transmit and receive data to and from a data bus in the electronic system of the vehicle through the electrical connector and the electrical connector is a plug-in connector which can be plugged into the electronic system of the vehicle.

5. The integrated GPS receiver and cellular transceiver module according to claim 1, further comprising a subscriber identity module (SIM) disposed on the printed circuit board substrate for storing data to be used with signals processed by the at least one first integrated circuit.

6. The integrated GPS receiver and cellular transceiver module according to claim 1, further comprising a non-volatile memory disposed on the printed circuit board substrate for storing map data to be used with signals processed by the at least one integrated circuit.

7. The integrated GPS receiver and cellular transceiver module according to claim 6, wherein said map data and information provided by the integrated GPS receiver and cellular transceiver module is communicated to an advanced driver assistance system of said vehicle.

8. The integrated GPS receiver and cellular transceiver module according to claim 6, wherein the at least one integrated circuit and the memory are disposed on one side of the printed circuit board substrate, and the GPS antenna is disposed on another side of the printed circuit board substrate.

9. The integrated GPS receiver and cellular transceiver module according to claim 2, wherein said at least one integrated circuit includes a first integrated circuit for converting radio frequency signals from the GPS antenna into intermediate frequency signals, and a second integrated circuit for performing operations on the intermediate frequency signals to produce GPS signals, and transmitting the GPS signals to the electronic system of the vehicle.

10. A method for providing an integrated GPS (global positioning system) receiver and cellular transceiver module comprising the steps of:
providing a printed circuit board substrate;
providing a cellular multiband antenna disposed on the printed circuit board substrate, wherein said cellular multiband antenna and a ground plane are formed in a single metallization layer of said printed circuit board substrate and said cellular multiband antenna comprises a first open-circuit stub, a second open-circuit stub and a short-circuit stub, the first open-circuit stub having a length of about 2.912 units and a width of about 0.05 units, the second open-circuit stub having a length of about 1.525 units and a width of about 0.3 units, and the short-circuit stub having a length of about 0.362 units and a width of about 0.05 units, respectively, said short-circuit stub being connected to said ground plane, said second open-circuit stub and said first open-circuit stub running parallel with said ground plane;
providing at least one first integrated circuit disposed on the printed circuit board substrate for processing signals from and signals to the cellular multiband antenna;
providing a GPS antenna on the printed circuit board substrate;
providing at least one second integrated circuit on the printed circuit board substrate for processing signals from the GPS antenna; and
providing an electrical connector on the printed circuit board substrate for establishing a data communication path between the at least one first integrated circuit, the at least one second integrated circuit and an electronic system of a vehicle, wherein the GPS receiver and cellular transceiver module is capable of being integrated into the electronic system of the vehicle.

11. The method according to claim 10, wherein said cellular multiband antenna comprises a cellular quadband polarization diverse folded inverted F antenna formed in a single conductive layer of said printed circuit board substrate.

12. The method according to claim 10, wherein the at least one first integrated circuit transmits and receives data to and from a data bus in the electronic system of the vehicle through the electrical connector.

13. The method according to claim 12, further comprising:
providing a subscriber identity module (SIM) on the printed circuit board substrate for storing information to be used with signals processed by the at least one first integrated circuit.

14. The method according to claim 10, further comprising:
providing a memory on the printed circuit board substrate for storing map data to be used with signals processed by the at least one second integrated circuit.

15. The method according to claim 14, further comprising:
supplying map data and position information from the GPS receiver and cellular transceiver to an advanced driver assistance system of the vehicle.

16. The method according to claim 14, wherein the cellular multiband antenna, the at least one first integrated circuit, the at least one second integrated circuit, the SIM, and the memory are disposed on one side of the printed circuit board substrate, and the GPS antenna is disposed on another side of the printed circuit board substrate.

17. The method according to claim 10, wherein the at least one second integrated circuit includes a first integrated circuit for converting radio frequency signals from the GPS antenna into intermediate frequency signals, and a second integrated circuit for performing operations on the intermediate frequency signals to produce GPS signals and transmitting the GPS signals to the electronic system of the vehicle.

18. The method according to claim 17, further comprising:
receiving, through the at least one first integrated circuit, GPS satellite and position data; and
initiating an assisted GPS operation responsive to said data.

19. The method according to claim 10, further comprising:
providing electrical conductors for interconnecting the cellular multiband antenna and the at least one first integrated circuit; and
providing electrical conductors on the printed circuit board substrate for interconnecting the GPS antenna, the at least one first integrated circuit and the at least one second integrated circuit.

20. The integrated GPS receiver and cellular transceiver module according to claim 1, further comprising:
electrical conductors for interconnecting the cellular multiband antenna and the at least one first integrated circuit; and electrical conductors for interconnecting the GPS antenna, the at least one first integrated circuit, and the at least one second integrated circuit.

\* \* \* \* \*